(12) United States Patent
Niigaki et al.

(10) Patent No.: US 7,217,932 B2
(45) Date of Patent: May 15, 2007

(54) UV SENSOR

(75) Inventors: Minoru Niigaki, Hamamatsu (JP); Yasufumi Takagi, Hamamatsu (JP); Kazutoshi Nakajima, Hamamatsu (JP); Yoshitaka Suzuki, Hamamatsu (JP); Nobuharu Suzuki, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 143 days.

(21) Appl. No.: 10/717,904

(22) Filed: Nov. 21, 2003

(65) Prior Publication Data

US 2004/0135094 A1  Jul. 15, 2004

(30) Foreign Application Priority Data

Nov. 25, 2002  (JP) .................... P2002-341426

(51) Int. Cl.
*G01J 5/10* (2006.01)
(52) U.S. Cl. .................................................. 250/372
(58) Field of Classification Search ............... 250/372; 257/21, 481
See application file for complete search history.

(56) References Cited

U.S. PATENT DOCUMENTS

| | | | | |
|---|---|---|---|---|
| 4,663,652 | A * | 5/1987 | Nishizawa ................... | 257/782 |
| 5,828,797 | A * | 10/1998 | Minott et al. ................. | 385/12 |
| 6,121,621 | A * | 9/2000 | Warashina et al. .......... | 250/372 |
| 6,137,123 | A * | 10/2000 | Yang et al. .................. | 257/184 |
| 6,265,727 | B1 * | 7/2001 | Kozodoy et al. ............. | 257/21 |
| 6,608,360 | B2 * | 8/2003 | Starikov et al. ............. | 257/481 |
| 6,881,979 | B2 * | 4/2005 | Starikov et al. ............. | 257/80 |

FOREIGN PATENT DOCUMENTS

JP  2002-083996  3/2002

* cited by examiner

*Primary Examiner*—Constantine Hannaher
(74) *Attorney, Agent, or Firm*—Drinker Biddle & Reath LLP

(57) ABSTRACT

A UV sensor (1) includes a container (5) in which the upper end opening of a metal side tube (2) is sealed with a front plate (3) composed of borosilicate glass as an incident light window and the lower end opening is sealed with a base plate (4). The front plate (3) serving as an incident light window constitutes part of the wall of container (5) by sealing the upper end opening of the metal side tube (2). A pin-type photodiode (6) is disposed inside the container (5). The pin-type photodiode (6) comprises a photoabsorption layer (9) formed from $In_xGa_{(1-x)}N$ ($0<x<1$) between an n-type contact layer (8) and a p-type contact layer (10).

4 Claims, 4 Drawing Sheets

UV SENSOR

BACKGROUND OF THE INVENTION

1. Field of the Invention

The present invention relates to a UV sensor equipped with a pin-type photodiode.

2. Related Background Art

Devices combining an optical filter having a property of transmitting only the light with a specific wavelength and a photodiode using semiconductor Si have been known as UV sensors for monitoring optical intensity of UV radiation with a wavelength close to 365 nm. Further, a pin-type nitride semiconductor photoreceiving element comprising a photoreceiving layer composed of an i-type gallium nitride compound semiconductor between an n-type layer and a p-type layer composed of gallium nitride compound semiconductors have been known as a device for selectively detecting light within a specific wavelength range (Japanese Patent Application Laid-open No. 2002-83996).

SUMMARY OF THE INVENTION

However, in the above-described optical filter, the number of components had to be increased as the intensity of incident light was reduced. Furthermore, with photoreceiving element described in the aforesaid patent application, it is difficult to detect selectively only the UV radiation with a wavelength close to 365 nm.

It is an object of the present invention to provide a UV sensor for selectively detecting only the light with a wavelength close to 365 nm.

The UV sensor in accordance with the present invention comprises an incident light window constituting part of the wall of a container, and a pin-type photodiode disposed inside the container and employed for photoelectrically converting the light that was transmitted through the incident light window, wherein the incident light window is composed of borosilicate glass and the pin-type photodiode comprises a photoabsorption layer formed from $In_xGa_{(1-x)}N$ (0<x<1) between an n-type nitride semiconductor layer and a p-type nitride semiconductor layer.

With the aforesaid UV sensor in accordance with the present invention, because the incident light glass is formed from borosilicate glass, the light with a wavelength of about 300 nm or larger is selectively transmitted. Furthermore, because the photoabsorption layer of the pin-type photodiode disposed inside the container is formed from $In_xGa_{(1-x)}N$ (0<x<1), the light with a wavelength of about 400 nm or less of the light that was transmitted through the incident light window is selectively photoelectrically converted. Therefore, only the light with a wavelength of about 365 nm can be selectively detected.

The incident light window composed of borosilicate glass is preferably formed to have a thickness of 200 μm or more. As a result, the incident light window of sufficient mechanical strength can be obtained. At the same time, the light with a wavelength of 300 nm or less can be reliably shielded and only the light with a wavelength of 300 nm or more can be selectively transmitted.

The composition ratio x of the $In_xGa_{(1-x)}N$ in the photoabsorption layer is preferably 0<x<0.05. As a result, the sensitivity with respect to the light with a wavelength of more than about 400 nm can be reduced.

Furthermore, the detection sensitivity with respect to the light with a wavelength of 405 nm is not more than 1/100 of the detection sensitivity with respect to the light with a wavelength of 365 nm. As a result, the light with a wavelength close to 365 nm can be detected more accurately.

The UV sensor in accordance with the present invention is preferably used as a power meter of a light source for photolithography. As a result, of the emission lines of a mercury lamp, the intensity of a emission line with a wavelength of 365 nm, which is widely used as a light source for photolithography and typically called an i line, can be accurately monitored.

DESCRIPTION OF THE PREFERRED EMBODIMENTS

Figure 1:
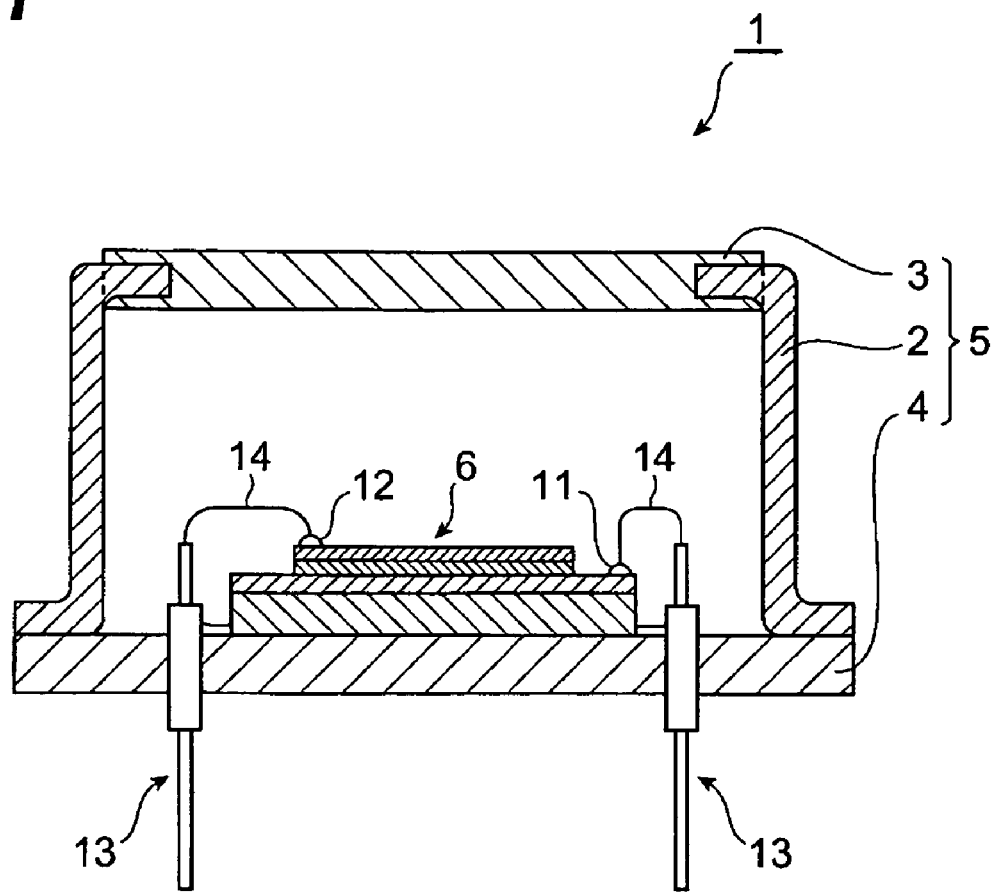
FIG. 1 is a schematic cross-sectional view of a UV sensor of the embodiment.

The preferred embodiment of the present invention will be described hereinbelow in greater detail with reference to the accompanying drawings. In the drawings identical elements are assigned with identical reference symbols and the redundant explanation thereof is omitted.

Figure 2:
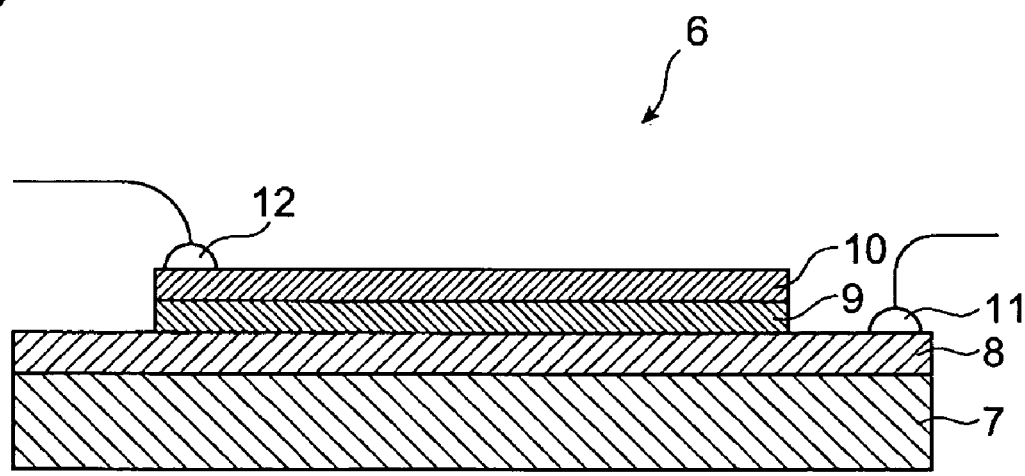
FIG. 2 is a schematic view illustrating a pin-type photodiode disposed in the UV sensor shown in FIG. 1.

FIG. 1 is a schematic cross-sectional view of a UV sensor of the embodiment. FIG. 2 is a schematic view illustrating a pin-type photodiode disposed inside the UV sensor shown in FIG. 1. Referring to FIG. 1, a UV sensor 1 comprises a container 5 in which the upper end opening of a metal side tube 2 is sealed with a front plate 3 composed of borosilicate glass as an incident light window and the lower end opening is sealed with a base plate 4. The front plate 3 serving as an incident light window constitutes part of the wall of container 5 by sealing the upper end opening of the metal side tube 2. The space inside the container 5 may be filled with air or nitrogen or evacuated.

A pin-type photodiode 6 is disposed inside the container 5. As shown in FIG. 2, the pin-type photodiode 6 comprises an n-type contact layer 8, a photoabsorption layer 9, and a p-type contact layer 10 successively laminated on a semiconductor substrate 7. Ohmic electrodes 11, 12 are formed on the n-type contact layer 8 and p-type contact layer 10, respectively.

A plurality of electrode pins 13 for applying voltage to the pin-type photodiode 6 or picking up the signals from the pin-type photodiode 6 are provided in the base plate 4 of the container 5. The electrode pins 13 are connected to the ohmic electrodes 11, 12 of the pin-type photodiode 6 via metal wires 14.

In the pin-type photodiode 6, the photoabsorption layer 9 is formed from $In_xGa_{(1-x)}N$ (0<x<1). Furthermore, the n-type contact layer 8 and p-type contact layer 10 are formed from a nitride semiconductor. The nitride semiconductor is a Group III-V compound semiconductor containing at least one of Al, Ga, In as a Group III element and mainly N as a Group V element.

The thickness of each element of the pin-type photodiode 6 will be described below.

The thickness of the semiconductor substrate 7 can be appropriately determined according to the properties of the material used and is determined by taking into account a mechanical strength which should be sufficient to prevent the substrate from breakage in usual handling, handleability in processing after epitaxial growth, and cost.

When a substrate with a comparatively large lattice mismatch between the substrate and the nitride semiconductor layer which is epitaxially grown on the substrate, for example, a sapphire substrate, is used as the semiconductor substrate 7, it is preferred that a buffer layer be inserted between the substrate and the nitride semiconductor layer. The thickness of the buffer layer is appropriately selected according to the type of epitaxial growth apparatus and growth conditions. It is not necessary to use a buffer layer when SiC, Si, GaN, AlN, ZnO, or the like is used for the semiconductor substrate 7.

The thickness of the n-type contact layer 8 is appropriately determined by controllability of the processing method. In the manufacture of the pin-type photodiode 6, patterning to the desired pattern is carried out by lithography after epitaxial growth, and then etching to a mesa structure is carried out from the front surface side by using a dry etching technique to expose the n-type contact layer 8.

The etching depth in dry etching is controlled by the dry etching time. When the thickness of the n-type contact layer 8 is small, the n-type contact layer 8 is sometimes penetrated because of overetching, or the surface of the n-contact layer 8 is sometimes not exposed because of insufficient etching. Furthermore, when the thickness of the n-type contact layer 8 is large, the epitaxial growth time is extended and cost is increased. Therefore, the thickness of the n-type contact layer 8 is selected based on the controllability of etching thickness which takes the aforesaid issues into account.

When the thickness of the photoabsorption layer 9 is small, sufficient absorption of light with the desired wavelength cannot be obtained. Furthermore, when the thickness is large, the electric field formed inside the photoabsorption layer 9 is weakened and the ratio of carriers which recombine before reaching the n-type contact layer 8 and the p-type contact layer 10 among the carriers excited by the incident light increases, thereby decreasing the sensitivity.

Because the incident light reaches the photoabsorption layer 9 by passing through the p-type contact layer 10, it is preferred that the p-type contact layer 10 has a small thickness to suppress attenuation of the incident light caused by light absorption. However, because a large amount of p-type dopants have to be doped to obtain a good ohmic characteristic, the thickness of the p-type contact layer 10 is selected by taking the diffusion of p-type dopants into account.

With the foregoing in view, the preferred/more preferred ranges for the thickness of each element are set as shown below. For the n-type contact layer 8 and p-type contact layer 10, only the preferred ranges are shown.

TABLE 1

| Semiconductor substrate 7 | 60 µm–5 mm/100 µm–1 mm |
|---|---|
| n-Type contact layer 8 | 0.8 µm–20 µm |
| Photoabsorption layer 9 | 30 nm–600 nm/50 nm–300 nm |
| p-Type contact layer 10 | 30 nm–800 nm |
| Buffer layer | 5 nm–100 nm/20 nm–50 nm |

The thickness of the front plate 3 composed of borosilicate glass is preferably at least 200 µm, more preferably 500 µm or more to obtain a sufficient mechanical strength required for an incident light window and to shield reliably the light with a wavelength of 300 nm or less. Furthermore, when the front plate is fused to a commercial metal side tube, it is desired that the front plate thickness be about 1 mm.

With the UV sensor 1 of the above-described embodiment, because the front plate 3 serving as an incident light window is formed from borosilicate glass, the light with a wavelength of about 300 nm or less of the UV radiation incident upon the front plate 3 is absorbed by the front plate 3, and the light with a wavelength of about 300 nm or more is selectively transmitted.

The light with a wavelength of about 300 nm or more that has passed through the front plate 3 falls upon the photoabsorption layer 9 of the pin-type photodiode 6 disposed inside the container 5. Because the photoabsorption layer 9 is formed from $In_xGa_{(1-x)}N$ (0<x<1), of the incident light with a wavelength of about 300 nm or more, only the light with a wavelength of about 400 nm or less is selectively photoelectrically converted, and electron-hole pairs are outputted as output signals from the ohmic electrodes 11, 12 to the outside of the UV sensor 1. Therefore, with the UV sensor 1 of the present embodiment. light with a wavelength close to 365 nm can be selectively detected.

Furthermore, because the UV sensor 1 of the present embodiment has a structure using the pin-type photodiode 6, the device size can be reduced by comparison with that of a photoelectron tube or the like and the high-voltage power source becomes unnecessary.

However, because the light with a wavelength of 300 nm or less has a high energy, if this light falls directly on the photodiode, the voltage resistance of the photodiode is degraded and sensitivity is decreased. With the UV sensor 1 of the present embodiment, because the front plate 3 composed of borosilicate glass has a thickness of 200 µm or more, the light with a wavelength of 300 nm or less is shielded. Therefore, the light with a wavelength of 300 nm or less which has a high energy, is cut off and only the low-energy light can be caused to fall upon the pin-type photodiode 6. Therefore, long-term stability of the pin-type photodiode 6 can be further increased.

The present invention will be described hereinbelow in greater detail based on working examples thereof, but the present invention is not limited to the below-described working examples.

In the present working example, a sapphire glass was used as a semiconductor substrate of a pin-type photodiode. The sapphire substrate was washed and set in an organometallic vapor phase growth apparatus, and then a buffer layer, an n-type contact layer, a photoabsorption layer, and a p-type contact layer were successively epitaxially grown in the order of description.

The material and thickness are shown for each layer in Table 2 below.

TABLE 2

| | |
|---|---|
| Buffer layer | InGaN/about 0.03 µm |
| n-Type contact layer | Si-doped InGaN/about 3 µm |
| Photoabsorption layer | undoped $In_xGa_{(1-x)}N$ (0 < x < 1)/about 0.2 µm |
| p-Type contact layer | Mg-doped InGaN/about 0.1 µm |

Here, the energy gap of the n-type contact layer and p-type contact layer is selected to be equal to the energy gap of the photoabsorption layer, or preferably larger than that.

The contact layers and buffer layer are not necessarily composed of InGaN and may be made from other nitride semiconductors. Furthermore, in the present embodiment, the nitride semiconductor layer was epitaxially grown by an organometallic vapor phase growth method, but epitaxial growth may be also conducted by other methods such as a hydride vapor phase growth method or molecular beam epitaxy method.

The epitaxially grown nitride semiconductor layer was removed from the organometallic vapor phase growth device after the temperature therein has been decreased to room temperature. Then, a metal for a p-type ohmic electrode was evaporated on the p-type contact layer located on the front surface of the nitride semiconductor layer and alloying was carried out at the prescribed temperature.

The prescribed patterning was then carried out by using photography, and a mesa structure was obtained by conducting etching from the front surface side by a dry etching method. The etching was carried out to the intermediate portion of the n-type contact layer.

The nitride semiconductor was then cut to the prescribed size, e.g., with a dicing apparatus, an n-type ohmic electrode was deposited on part of the n-type contact layer by using a mechanical mask, and alloying was conducted at the prescribed temperature.

The pin-type photodiode thus formed was then die bonded to a commercial base plate with a solder, and p- and n-type ohmic electrodes were electrically connected with a Au wire to the electrode pins provided on the base plate.

A UV sensor was then obtained by fusing a front plate composed of borosilicate glass as an incident light window to a metal side tube and then fusing the metal side tube to the base plate.

In the present embodiment, the inside of the container composed of the metal side tube, base plate, and front plate was filled with a nitrogen atmosphere. Further, borosilicate hard glass (KB hard glass) manufactured by NEC Glass Components, Ltd. was used as the borosilicate glass constituting the front plate.

In the aforesaid UV sensor, of the UV radiation falling on the front plate serving as an incident light window, the light with a wavelength of about 300 nm or less is absorbed by the front plate composed of borosilicate glass. The light with a wavelength of more than about 300 nm or more is transmitted through the front plate and falls on the p-type contact layer.

The p-type contact layer has an energy gap equal to that of the photoabsorption layer or larger and a small thickness. Therefore, practically all the light falling on the p-type contact layer is transmitted therethrough.

This transmitted light is absorbed by the photoabsorption layer and generates electron-hole pairs which are picked up from the ohmic electrodes as an output signal.

In this process, the light with a wavelength larger than wavelength corresponding to the energy band gas of the photoabsorption layer is transmitted through the photoabsorption layer. Therefore, this light is not converted into the output signal of the pin-photodiode.

Figure 3:
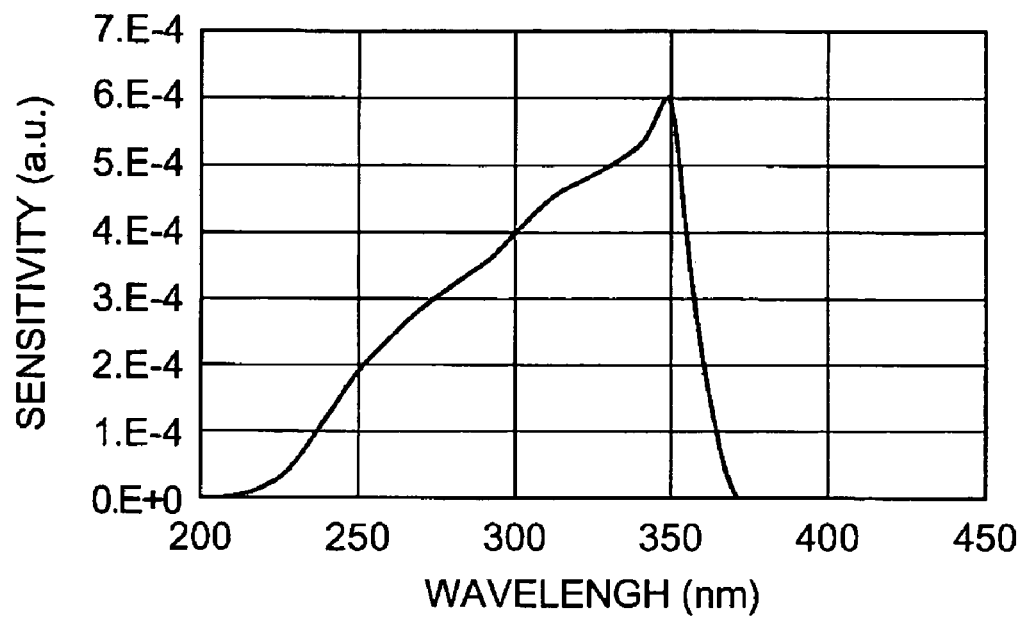
FIG. 3 illustrates a spectral sensitivity characteristic of the pin-type photodiode in the case the content ratio x of In in the undoped $In_xGa_{(1-x)}N$ photoabsorption layer is zero.

For example, when the content ratio x of In in the photoabsorption layer is zero, that is, in the case of GaN photoabsorption layer, the wavelength corresponding to the energy gap thereof becomes close to 350 nm at room temperature. FIG. 3 shows a spectral sensitivity characteristic of the pin-photodiode in the case the content ratio x of In in the photoabsorption layer is zero. It is clear that the sensitivity corresponding to the light with a wavelength of 365 nm which is the i line of a mercury lamp decreases to about ½ of the peak value. The sensitivity plotted against the ordinate in FIG. 3 is measured in arbitrary units (a. u.).

For this reason, in the embodiment of the present invention, $In_xGa_{(1-x)}N$ (0<x<1) is used as the photoabsorption layer. Further, the inventors have experimentally established that in order to obtain a high sensitivity to a emission line with a wavelength of 365 nm in a mercury lamp and decrease the sensitivity to a emission line with a wavelength of 405 nm, it is preferred that the content ratio x of In in the $In_xGa_{(1-x)}N$ (0<x<1) layer be 0<x<0.05.

Figure 4:
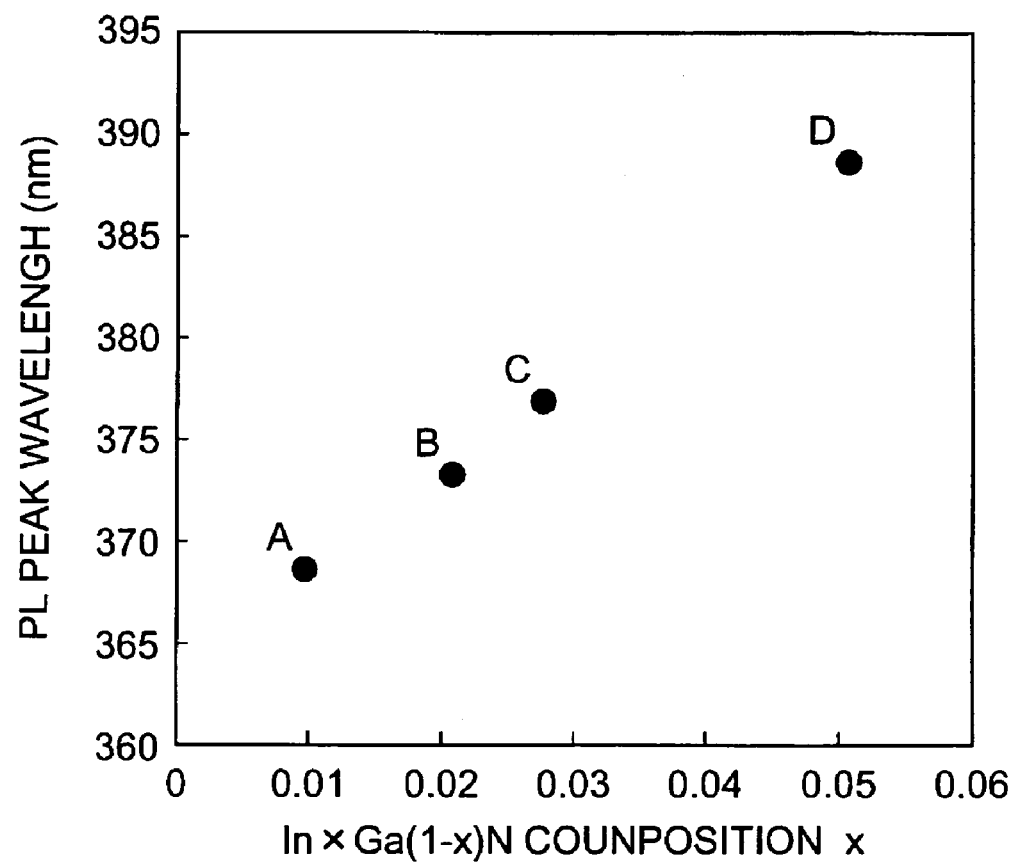
FIG. 4 illustrates the relation between the content ratio x of In in the $In_xGa_{(1-x)}N$ (0<x<1) layer and a peak wavelength of photoluminescence (PL)

FIG. 4 shows the relation between the content ratio x of In in the $In_xGa_{(1-x)}N$ (0<x<1) layer and the peak wavelength of photoluminescence (PL). It is well known that a PL peak wavelength almost correlates with a photoabsorption edge. In FIG. 4, points A–D indicate cases with a content ratio x of 0.01, 0.02, 0.03, 0.05, respectively. As shown in FIG. 4, when x>0.05, the PL peak wavelength becomes about 390 nm and there is a possibility of obtaining a sensitivity with respect to the emission line with a wavelength of 405 nm in a mercury lamp.

Figure 5:
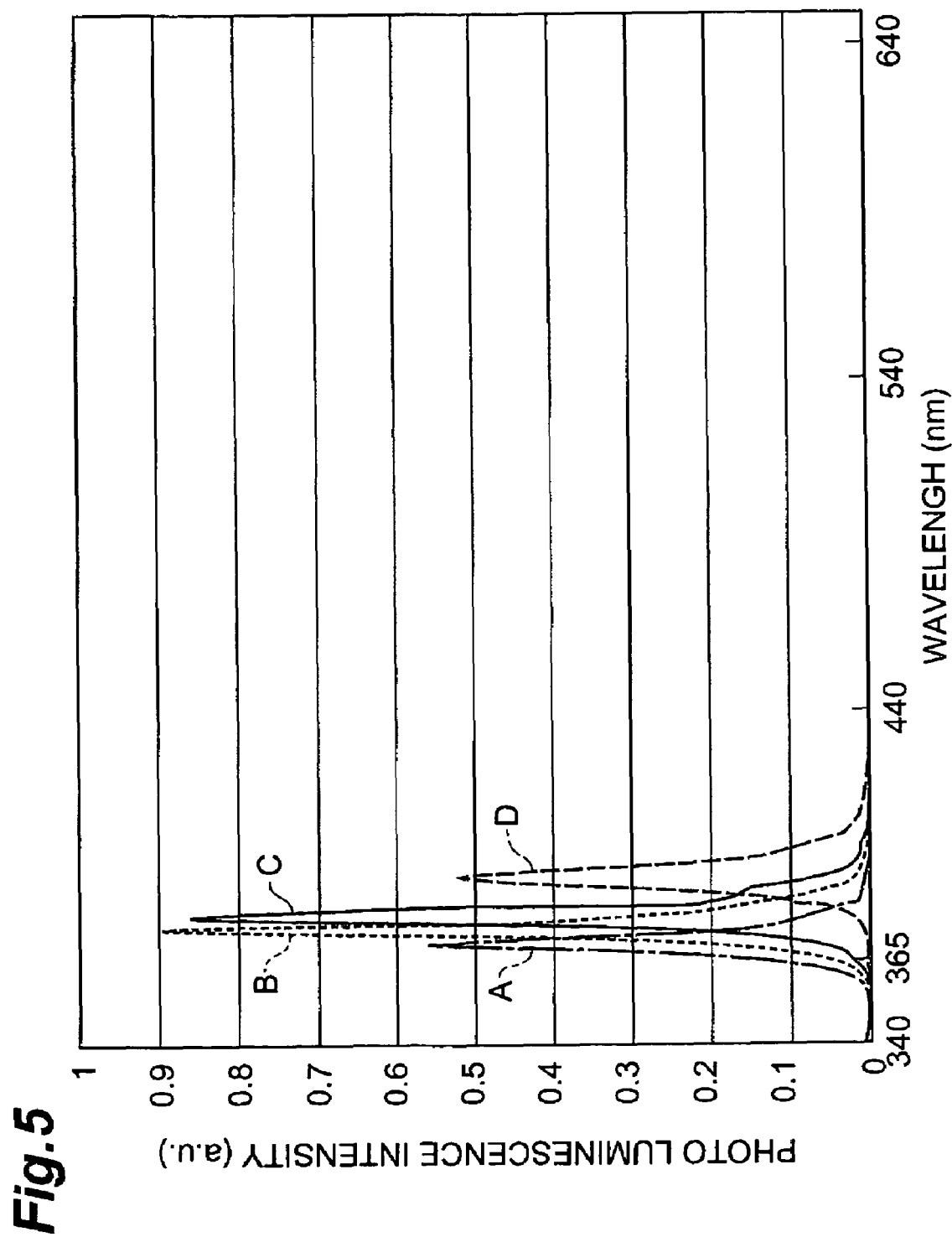
FIG. 5 illustrates the relation between the wavelength in the case the content ratio x of In corresponds to points A–D shown in FIG. 4 and photoluminescence (PL) intensity.

FIG. 5 illustrates the relation between the wavelength in the case the content ratio x of In corresponds to points A–D shown in FIG. 4 and photoluminescence (PL) intensity. The intensity plotted against the ordinate is measured in arbitrary units (a. u.). As shown in FIG. 5, it is clear that in the case of graph A with a content ratio x of In of 0.01, the intensity of light with a wavelength close to 365 nm increases, and in the case of graph B with a content ratio x of In of 0.05, the intensity of light with a wavelength close to 405 nm increases. Therefore, it was found that in order to decrease the sensitivity to the light with a wavelength of about 405 nm and to provide for the sensitivity with respect to the light with a wavelength of about 365 nm, it is most preferred that the content ratio x of In in the $In_xGa_{(1-x)}N$ (0<x<1) layer be 0<x<0.05.

Figure 6:
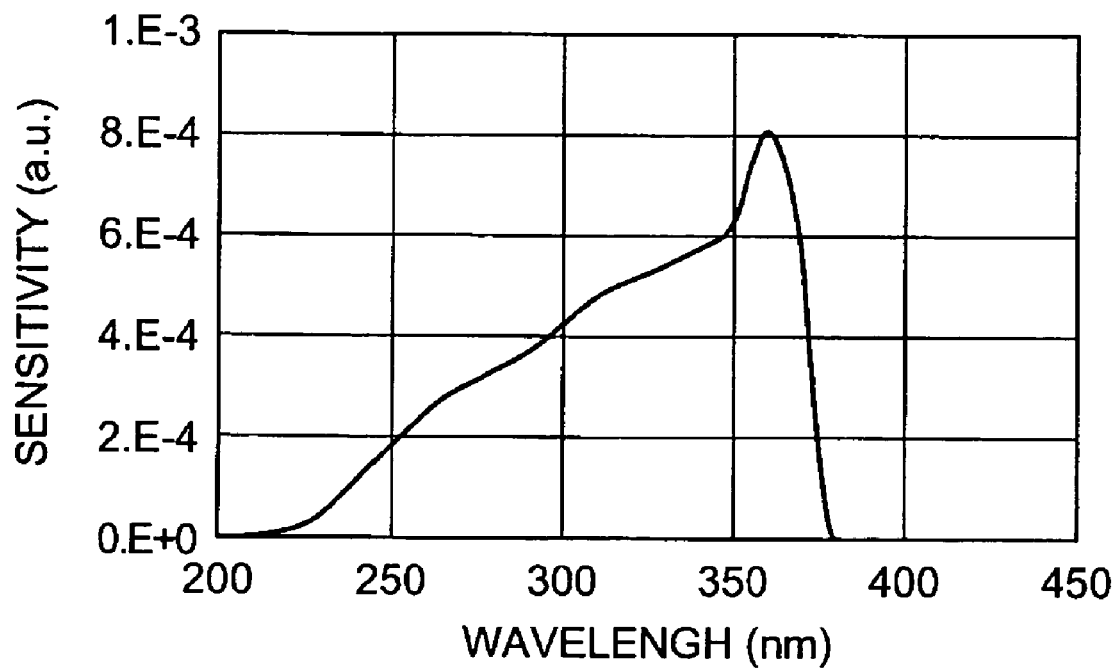
FIG. 6 illustrates a spectral sensitivity characteristic of the pin-type photodiode in the case the content ratio x of In in the $In_xGa_{(1-x)}N$ photoabsorption layer is 0.01.

FIG. 6 illustrates a spectral sensitivity characteristic of the pin-type photodiode in the case the content ratio x of In in the $In_xGa_{(1-x)}N$ photoabsorption layer is 0.01. The figure shows that when the content ratio x of In is 0<x<0.05, the peak value of sensitivity is close to a wavelength of 365 nm which is the object of detection. However, sensitivity is also demonstrated at a wavelength of about 254 nm which is the other emission line of a mercury lamp, and the sensitivity cannot be directly provided only with respect to the light with a wavelength of 365 nm.

Figure 7:
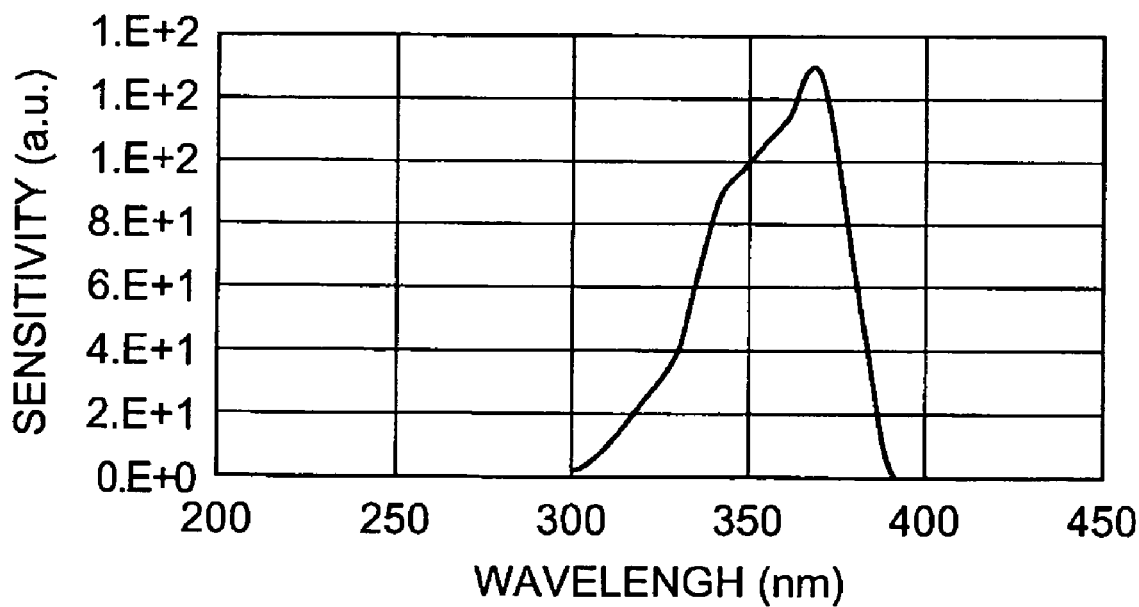
FIG. 7 illustrates a spectral sensitivity characteristic in the case the content ratio x of In in the $In_xGa_{(1-x)}N$ photoabsorption layer is 0.01 in the UV sensor of the embodiment.

FIG. 7 illustrates a spectral sensitivity characteristic of a UV sensor of the present embodiment which comprises a pin-type photodiode with a content ratio x of In in the $In_xGa_{(1-x)}N$ photoabsorption layer of 0.01 and an incident light window composed of borosilicate glass. As shown in the figure, the peak value of sensitivity is close to a wavelength of 365 nm. Table 3 shows a detection sensitivity with respect to a wavelength of 405 rim, when the sensitivity at a wavelength of 365 nm is taken for 100.

TABLE 3

| Wavelength | Detection sensitivity |
|---|---|
| 365 nm | 100 |
| 405 nm | 0.64 |

Thus, it is clear that the sensitivity at a wavelength of 405 nm, which is a emission line of a mercury lamp, became less than 1/100 of the sensitivity at a wavelength of 365 nm. Furthermore, at a wavelength of 254 nm, which is the other emission line of a mercury lamp, the sensitivity was reduced to less than the measurement limit. As a result, the light with a wavelength of 365 nm of a mercury lamp can be detected with the UV sensor of the present embodiment.

Therefore, among a large number of emission lines of a mercury lamp, for example, 1014 nm, 580 nm, 546 nm, 436 nm, 405 nm, 365 nm, and 254 nm, only the bright line at a wavelength of 365 nm, which is widely used as a light source for photolithography and is typically called an i line, can accurately monitored. Therefore, the UV sensor of this embodiment of the present invention is suitable as a power meter for a light source for photolithography.

With the UV sensor of the present invention, forming the incident light window of borosilicate glass and forming the photoabsorption layer of the pin-type photodiode from $In_{xGa(1-x)}N$ (0<x <1) make it possible to detect selectively the light with a wavelength close to 365 nm.

What is claimed is:

1. A UV sensor comprising:
   an incident light window constituting part of the wall of a container; and
   a pin-type photodiode disposed inside said container and employed for photoelectrically converting the light that was transmitted through said incident light window,
   wherein
   said incident light window is composed of borosilicate glass,
   said pin-type photodiode comprises a photoabsorption layer formed from $In_{xGa(1-x)}N$ (0<x<1) between an n-type nitride semiconductor layer and a p-type nitride semiconductor layer, and
   each energy gap of said n-type nitride semiconductor layer and p-type nitride semiconductor layer is larger than the energy gap of said photoabsorption layer.

2. The UV sensor according to claim 1, wherein said incident light window composed of borosilicate glass has a thickness equal to or greater than 200 μm.

3. The UV sensor according to claim 1, wherein the composition ratio x of the $In_xGa_{(1-x)}N$ in said photoabsorption layer is 0<x<0.05.

4. The UV sensor according to claim 1, wherein the detection sensitivity of said light with a wavelength of 405 nm is not more than 1/100 of the detection sensitivity of said light with a wavelength of 365 nm.

* * * * *